US009048816B2

(12) United States Patent
Ito et al.

(10) Patent No.: US 9,048,816 B2
(45) Date of Patent: Jun. 2, 2015

(54) ACOUSTIC WAVE FILTER

(75) Inventors: Motoki Ito, Higashiomi (JP); Naoki Hashimura, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 29 days.

(21) Appl. No.: 14/002,004

(22) PCT Filed: Feb. 16, 2012

(86) PCT No.: PCT/JP2012/053679
§ 371 (c)(1),
(2), (4) Date: Aug. 28, 2013

(87) PCT Pub. No.: WO2012/117864
PCT Pub. Date: Sep. 7, 2012

(65) Prior Publication Data
US 2013/0335172 A1    Dec. 19, 2013

(30) Foreign Application Priority Data

Feb. 28, 2011  (JP) .................................. 2011-041928
May 31, 2011  (JP) .................................. 2011-121797

(51) Int. Cl.
*H03H 9/00*   (2006.01)
*H03H 9/64*   (2006.01)

(52) U.S. Cl.
CPC .............. *H03H 9/64* (2013.01); *H03H 9/0071* (2013.01); *H03H 9/6489* (2013.01); *H03H 9/0038* (2013.01); *H03H 2250/00* (2013.01)

(58) Field of Classification Search
None
See application file for complete search history.

(56) References Cited

U.S. PATENT DOCUMENTS

| 2004/0233018 | A1* | 11/2004 | Watanabe et al. | 333/193 |
| 2008/0266023 | A1* | 10/2008 | Tanaka | 333/133 |
| 2009/0153269 | A1 | 6/2009 | Ono et al. | |
| 2009/0273409 | A1* | 11/2009 | Okuda | 333/133 |
| 2010/0052807 | A1* | 3/2010 | Shin | 333/133 |
| 2011/0006855 | A1* | 1/2011 | Fujiwara et al. | 333/132 |

FOREIGN PATENT DOCUMENTS

| JP | H07-282876 A | 10/1995 |
| JP | 2006-073625 A | 3/2006 |
| JP | 2009-147740 A | 7/2009 |
| JP | 2009-225085 A | 10/2009 |
| JP | 2009-260463 A | 11/2009 |
| WO | 2008/096514 A1 | 8/2008 |
| WO | 2009/113274 A1 | 9/2009 |
| WO | 2010/150882 A1 | 12/2010 |

OTHER PUBLICATIONS

International Search Report dated Mar. 19, 2012, issued for International Application No. PCT/JP2012/053679.

* cited by examiner

*Primary Examiner* — Long Nguyen
(74) *Attorney, Agent, or Firm* — Procopio, Cory, Hargreaves & Savitch LLP

(57) ABSTRACT

An acoustic wave filter has a first signal line connecting one among the plurality of first IDT electrodes and the first balanced signal terminal; a second signal line connecting the other first IDT electrode with the second balanced signal terminal; a third signal line connecting one among the plurality of second IDT electrodes with the second balanced signal terminal; and a fourth signal line connecting the other second IDT electrode with the first balanced signal terminal. The fourth signal line has an intersection portion three-dimensionally intersecting with a part of the second signal line. The intersection portion extends in a direction inclined relative to the second signal line on the major surface.

6 Claims, 8 Drawing Sheets

ACOUSTIC WAVE FILTER

TECHNICAL FIELD

The present invention relates to an acoustic wave filter such as a surface acoustic wave (SAW) filter.

BACKGROUND ART

As a portable data terminal such as a mobile phone, a multiband type having two or more communication systems has been developed.

Such a multiband compatible mobile phone sometimes uses a plurality of acoustic wave filters using different pass frequency bands.

Further, an acoustic wave filter which is provided with a function of converting an unbalanced signal and balanced signals has been developed.

The acoustic wave filter provided with the function of converting the unbalanced signal and the balanced signals usually has one input terminal for the unbalanced signal and two output terminals for the balanced signals. Therefore, for example, when it is intended to mount two acoustic wave filters of this type, two input terminals and four output terminals become necessary, so many terminals and lines become necessary.

Therefore, there is known an acoustic wave filter which shares a predetermined terminal among the four output terminals for decreasing the number of terminals and simplifying the lines (see for example Japanese Patent Publication No. 2009-260463A).

However, a conventional acoustic wave filter sharing an output terminal had the problem that the insertion loss easily became worse.

The present invention was devised in order to solve the above problem and has as an object thereof to provide an acoustic wave filter which is resistant to worsening of insertion loss even when an input terminal or output terminal is shared.

SUMMARY OF INVENTION

An acoustic wave filter according to an aspect of the present invention has a substrate; a first acoustic wave filter part which has a plurality of first IDT electrodes which are arranged in a line, and generates an acoustic wave propagating in a first direction of a major surface of the substrate; a second acoustic wave filter part which has a plurality of second IDT electrodes which are arranged in a line, and generates an acoustic wave propagating in the first direction; a first unbalanced signal terminal which is located in a region on one sides of the first acoustic wave filter part and the second acoustic wave filter part in a direction perpendicular to the first direction, and is electrically connected to the first acoustic wave filter part; a second unbalanced signal terminal which is located in the region on the one sides, and is electrically connected to the second acoustic wave filter part; a first balanced signal terminal which is located next to the first acoustic wave filter part so that the first acoustic wave filter part is located between the first balanced signal terminal and the first unbalanced signal terminal; a second balanced signal terminal which is located next to the second acoustic wave filter part so that the second acoustic wave filter part is located between the second balanced signal terminal and the second unbalanced signal terminal; a first signal line connecting one first IDT electrode of the plurality of first IDT electrodes with the first balanced signal terminal; a second signal line connecting another one first IDT electrode of the plurality of first IDT electrodes with the second balanced signal terminal, the another one first IDT electrode being positioned on a side closer to the second acoustic wave filter part than the one first IDT electrode connected to the first balanced signal terminal; a third signal line connecting one second IDT electrode of the plurality of second IDT electrodes with the second balanced signal terminal; and a fourth signal line which connects another one second IDT electrode of the plurality of second IDT electrodes with the first balanced signal terminal, the another one second IDT electrode being positioned on a side closer to the first acoustic wave filter part than the one second IDT electrode connected to the second balanced signal terminal, and has an intersection portion three-dimensionally intersecting with a part of the second signal line, the intersection portion extending in a direction inclined relative to the second signal line on the major surface.

According to the above acoustic wave filter, provision is made of a fourth signal line connecting the second IDT electrode and the first balanced signal terminal and having an intersection portion three-dimensionally intersecting with a part of the second signal line, in which this intersection portion extends in a direction inclined relative to the second signal line on the major surface of the substrate. Therefore, between signal lines having different potentials, leakage of a signal to another party is suppressed, so deterioration of insertion loss can be suppressed.

BRIEF DESCRIPTION OF DRAWINGS

FIG. 4A is a graph which shows the results of computation of the frequency characteristics in Example 1 and a comparative example, while

FIG. 5A is a graph showing the results of computation of the VSWR characteristics of input terminals in Example 1 and a comparative example, while

FIG. 6A is a graph showing the results of measurement of the frequency characteristics in Example 2 and Example 3, while

FIG. 7A is a graph showing the results of measurement of the VSWR characteristics of the input terminals in Example 1 and Example 2, while

FIG. 8A is a graph showing the results of measurement of the frequency characteristics in a broad range in first SAW filter parts in Example 2 and Example 3, while

DESCRIPTION OF EMBODIMENTS

Figure 1:
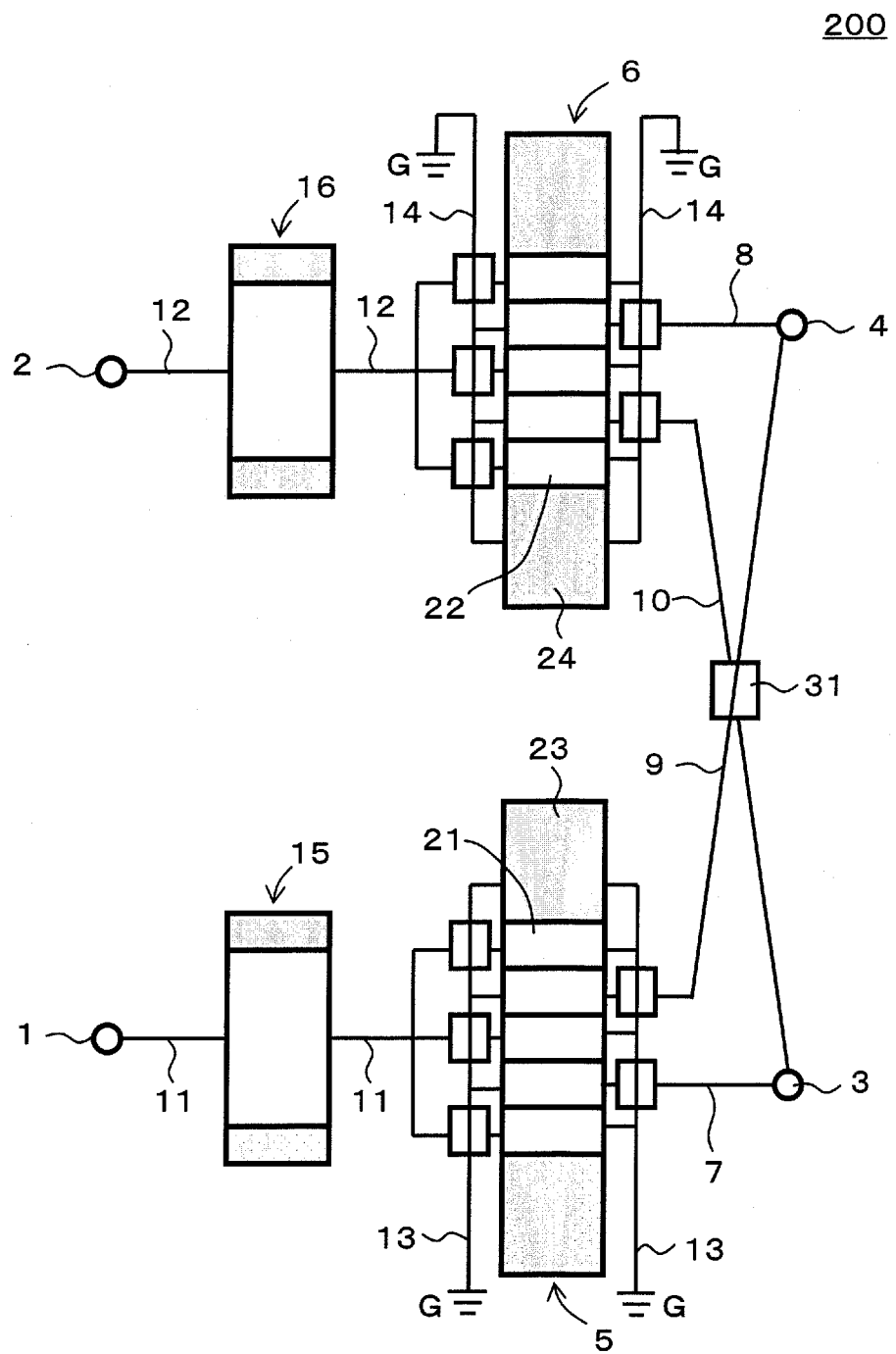
FIG. 1A circuit diagram of a SAW filter according to an embodiment of the present invention.

Below, embodiments of an acoustic wave filter according to the present invention are explained in detail with reference to the drawings. Note that, in the drawings explained below, the same portions are assigned the same notations. Further, the size of each line pattern, the distance between electrodes, and so on are schematically shown for explanation. Therefore, The present invention is not limited to them.

FIG. 1 is a circuit diagram of a SAW filter 200 according to an embodiment of the present invention. The SAW filter 200 is provided with a first SAW filter part 5, second SAW filter part 6, first unbalanced signal terminal 1, second unbalanced signal terminal 2, first balanced signal terminal 3, and second balanced signal terminal 4.

The first SAW filter part 5 includes five first IDT electrodes 21 arranged in a line and two first reflector electrodes 23 which are arranged on the two sides of the five first IDT electrodes 21. The first SAW filter part 5 has a filter function of passing only signals of a predetermined frequency band therethrough and blocking signals out of the predetermined frequency band so that they will not pass. The pass frequency band of the first filter part 5 is for example 1805 MHz to 1880 MHz.

The first SAW filter part 5 and the first unbalanced signal terminal 1 are electrically connected by a fifth signal line 11. More specifically, among five first IDT electrodes 21 in the first SAW filter part 5, the first IDT electrode 21 located at the center and the IDT electrodes 21 located on the two ends are electrically connected with the first unbalanced signal terminal 1 by the fifth signal line 11.

The first SAW filter part 5 and the first unbalanced signal terminal 3 are electrically connected by a first signal line 7. More specifically, among the five IDT electrodes 21 in the first SAW filter part 5, the first IDT electrode 21 located at the second position sequentially counted from the first IDT electrode 21 which is located on the end farthest from the second SAW filter part 6 is connected to the first balanced signal terminal 3 by the first signal line 7.

The first SAW filter part 5 and the second balanced signal terminal 4 are electrically connected by a second signal line 9. More specifically, among the five IDT electrodes 21 in the first SAW filter part 5, the first IDT electrode 21 located at the fourth position sequentially counted from the first IDT electrode 21 which is located on the end farthest from the second SAW filter part 6 is connected to the second balanced signal terminal 4 by the second signal line 9.

The first SAW filter part 5 forms a longitudinally coupled SAW filter and has a function of converting an unbalanced signal and balanced signals. In the present embodiment, an unbalanced signal is input from the unbalanced signal terminal 1, that unbalanced signal is converted to balanced signals in the first SAW filter part 5, and these balanced signals are output from the first balanced signal terminal 3 and second balanced signal terminal 4. That is, the first SAW filter part 5 has a function of converting an input unbalanced signal to balanced signals and outputting the results. Note that, relative to the signal output from the first balanced signal terminal 3, the signal output from the second balanced signal terminal 4 differs in phase by about 180°, and the amplitudes of the two signals are roughly equal.

Each of the first IDT electrodes 21 in the first SAW filter part 5 is connected through a first reference potential line 13 to a reference potential portion G. Note that, the "reference potential" means for example the ground potential.

Between the first unbalanced signal terminal 1 and the first SAW filter part 5, a first resonator 15 is connected in series with respect to the first SAW filter part 5. This first resonator 15 is for making the amount of attenuation out of the pass frequency band of the first SAW filter part 5 larger.

The second SAW filter part 6 includes five second IDT electrodes 22 arranged in a line and two second reflector electrodes 24 arranged on the two sides of the five second IDT electrodes 22. The second SAW filter part 6 has a filter function of passing only signals of a predetermined frequency band therethrough and blocking signals out of the predetermined frequency band. The pass frequency band of the second SAW filter part 6 is different from the pass frequency band of the first filter part 5. That pass frequency band is for example 1930 MHz to 1990 MHz.

The second SAW filter part 6 and the first unbalanced signal terminal 2 are electrically connected by a sixth signal line 12. More specifically, among the five second IDT electrodes 22 in the second SAW filter part 6, the second IDT electrode 22 located at the center and the second IDT electrodes 22 located on the two ends are electrically connected to the second unbalanced signal terminal 2 by the sixth signal line 12.

The second SAW filter part 6 and the second balanced signal terminal 4 are electrically connected by a third signal line 8. More specifically, among the five second IDT electrodes 22 in the second SAW filter part 6, the second IDT electrode 22 located at the second position sequentially counted from the second IDT electrode 22 which is located on the end farthest from the first SAW filter part 5 is connected to the second balanced signal terminal 4 by the third signal line 8.

The second SAW filter part 6 and the first balanced signal terminal 3 are electrically connected by a fourth signal line 10. More specifically, among the five second IDT electrodes 22 in the second SAW filter part 6, the second IDT electrode 22 located at the fourth position sequentially counted from the second IDT electrode 22 which is located on the end farthest from the first SAW filter part 5 is connected to the first balanced signal terminal 3 by the fourth signal line 10.

The second SAW filter part 6 configures a longitudinally coupled SAW filter and has a function of converting an unbalanced signal and balanced signals. In the present embodiment, an unbalanced signal is input from the unbalanced signal terminal 2, that unbalanced signal is converted to balanced signals in the second SAW filter part 6, and these balanced signals are output from the first balanced signal terminal 3 and second balanced signal terminal 4. That is, the second SAW filter part 6 has a function of converting an input unbalanced signal to balanced signals and outputting the results. Note that, relative to the signal output from the first balanced signal terminal 3, the signal output from the second balanced signal terminal 4 differs in phase by about 180°, and the amplitudes of the two signals are roughly equal.

Each of the second IDT electrodes 22 in the second SAW filter part 6 is connected to the reference potential portion G by the second reference potential line 14.

Between the second unbalanced signal terminal 2 and the second SAW filter part 6, a second resonator 16 is connected in series with respect to the second SAW filter part 6. This second resonator 16 is for making the amount of attenuation out of the pass band of the second SAW filter part 6 larger.

By forming a circuit configuration as explained above, in the SAW filter 200, the first balanced signal terminal 3 and second balanced signal terminal 4 which are output terminals of the first SAW filter part 5 function as the output terminals of the second SAW filter part 6 as well. That is, the output terminals of the first SAW filter part 5 and the output terminals of the second SAW filter part 6 are shared.

By sharing the output terminals of two filter parts in this way, the number of terminals can be decreased by two compared with a filter having output terminals which are not shared, therefore the SAW filter 200 can be reduced in size by that amount.

On the other hand, by sharing the output terminals of the two filter parts, leakage of a signal output from one filter part to the other filter part through the signal line is a concern. For example, a balanced signal which was output from the first SAW filter part 5 to the second signal line 9 is liable to not be output from the second balanced signal terminal 4 to the outside, but be input through the third signal line 8 to the second SAW filter part 6. If a signal which was output from one filter part is input to another filter part in this way, the insertion loss characteristic of the SAW filter 200 deteriorates.

Therefore, in order to suppress such leakage of a signal, the impedance of each filter part is adjusted. Specifically, the second SAW filter part 6 is given a high impedance in the pass frequency band of the first SAW filter part 5, while the first SAW filter part 5 is given a high impedance in the pass frequency band of the second SAW filter part 6. The impedance is adjusted for example by changing the distance between the centers of adjacent electrode fingers in each filter part or crossing width of the electrode fingers.

Figure 2:
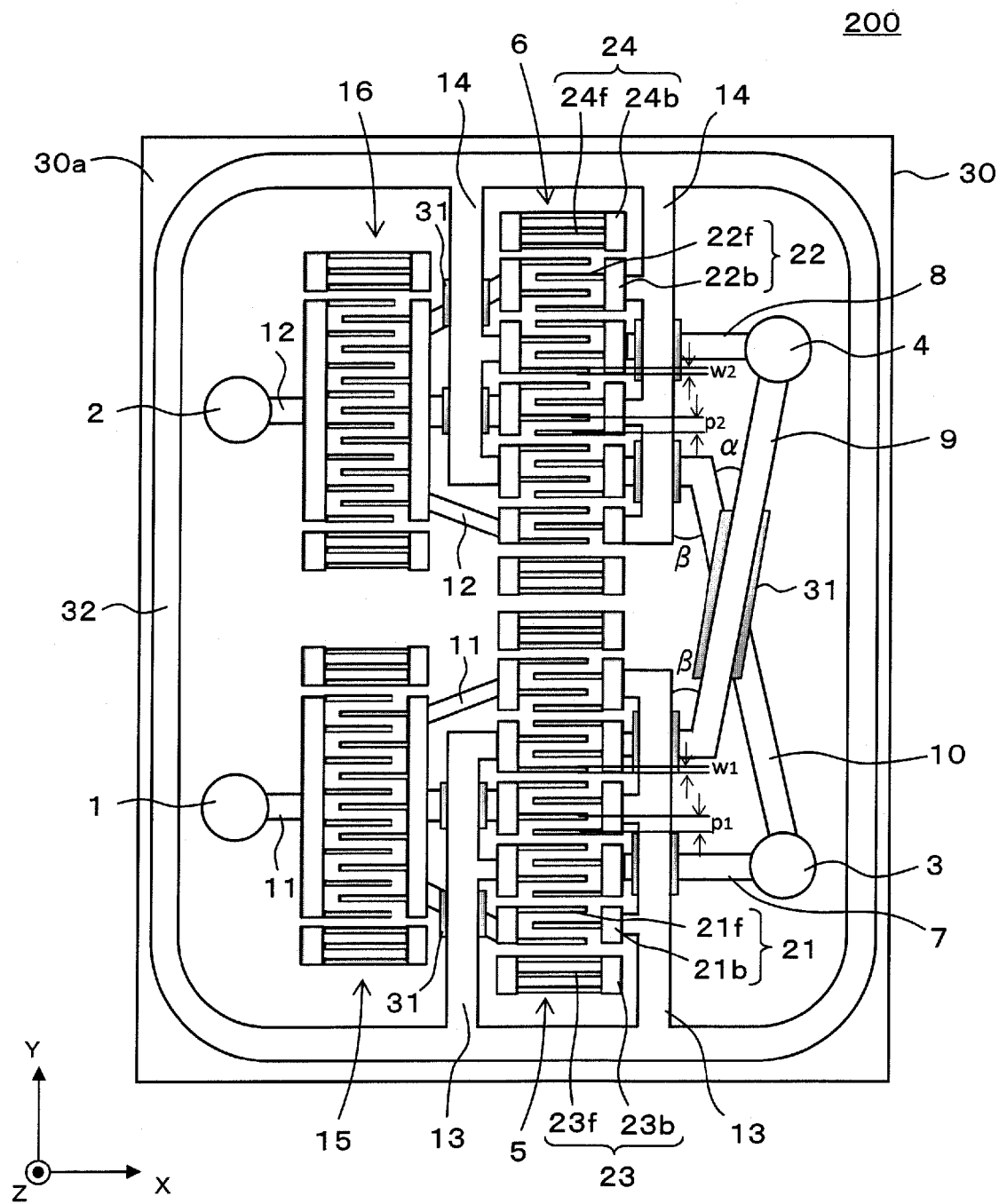
FIG. 2A plan view of the SAW filter according to the embodiment of the present invention.

FIG. 2 is a plan view of the SAW filter 200. Electrodes, lines, terminals, and another members configuring the SAW filter 200 are formed on a major surface 30a of a piezoelectric substrate 30.

The piezoelectric substrate 30 is formed by a piezoelectric substance exhibiting a piezoelectric effect. The piezoelectric substance is for example $LiNbO_3$ or $LiTaO_3$. The piezoelectric substrate 30 is for example a block shape. Where the piezoelectric substrate 30 is a block shape, its thickness dimension (dimension in Z-direction), lateral width dimension (dimension in X-direction), and longitudinal width dimension (dimension in Y-direction) are for example 0.1 mm to 0.3 mm, 0.5 mm to 2 m, and 0.5 mm to 0.2 mm.

The first IDT electrodes 21 are formed so that the first SAW filter part 5 can generate a SAW propagating in the Y-direction (first direction) on the major surface 30a of the piezoelectric substrate 30. Specifically, a first IDT electrode 21 includes a pair of bus bars 21b which extend in the Y-direction and are arranged in parallel and a plurality of electrode fingers 21f which extend from each of the pair of bus bars 21b toward the other bus bar and is arranged so that the electrode fingers extending from the pair of bus bars 21b mesh each other. The tip end of an electrode finger 21f which extends from one bus bar 21b has a gap of a predetermined interval from the other bus bar 21b. In this gap portion, a dummy electrode finger which extends from the other bus bar 21b and is prevented from connection with the tip end of the electrode finger 21f extending from the one bus bar 21b may be provided.

The plurality of electrode fingers 21f are arranged so that a distance $p_1$ between the centers of adjacent electrode fingers 21f becomes for example equal to a half wavelength of the wavelength $\lambda$ of the SAW at the frequency to be resonated. The wavelength $\lambda(2p_1)$ is for example 1.5 μm to 6 μm. The width $w_1$ of each electrode finger 21f is suitably set in accordance with the electrical characteristics etc. demanded from the first SAW filter part 5 and is for example $0.2p_1$ to $0.8p_1$ with respect to the distance $p_1$ between the centers. Further, by arranging the electrode fingers 21f so that the phases of the two IDT electrodes 21 on the two sides of the IDT electrode 21 at the center are inverted from each other, the unbalanced signal is converted to the balanced signals in the first SAW filter part 5. Specifically, between the two IDT electrodes 21 on the two sides of the IDT electrode 21 at the center, the arrangements of the electrode fingers 21f for the reference potential and the electrode fingers 21f for the signal become inverse to each other when viewed from the IDT electrode 21f at the center.

Further, each of the two first reflector electrodes 23 arranged on the two sides of the five first IDT electrodes 21 includes a pair of bus bars 23b which extend in the Y-direction and are arranged in parallel and electrode fingers 23f each having two ends connected to the pair of bus bars 23b. Among the plurality of electrode fingers 23f of the first reflector electrode 23, the distance between the centers of adjacent electrode fingers 23f is made roughly equal to the distance $p_1$ between the centers of the electrode fingers 21f of the first IDT electrode 21.

The second IDT electrodes 22 are formed so that the second SAW filter part 6 can generate a SAW propagating in the Y-direction on the major surface 30a of the piezoelectric substrate 30. Specifically, a second IDT electrode 22 includes a pair of bus bars 22b which extend in the Y-direction and are arranged in parallel and a plurality of electrode fingers 22f which extend from each one of the pair of bus bars 22b toward the other bus bar and is arranged so that the electrode fingers extending from the pair of bus bars 22b mesh each other. The tip end of the electrode finger 22f extending from one bus bar 22b has a gap of predetermined interval from the other bus bar 22b. In this gap portion, a dummy electrode finger which extends from the other bus bar 22b and is prevented from connection with the tip end of the electrode finger 22f extending from the one bus bar 22b may be provided.

The plurality of electrode fingers 22f are arranged so that a distance $p_2$ between the centers of adjacent electrode fingers 22f becomes for example equivalent to a half wavelength of the wavelength $\lambda$ of the SAW at the frequency to be resonated. The wavelength $\lambda(2p_2)$ is for example 1.5 μm to 6 μm. The width $w_2$ of each electrode finger 22f is suitably set in accordance with the electrical characteristics etc. demanded from the second SAW filter part and is for example $0.2p_2$ to $0.8p_2$ with respect to the distance $p_2$ between the centers. Further, regarding the two IDT electrodes 22 on the two sides of the IDT electrode 22 at the center, by arranging the electrode fingers 22f so that the arrangements of the electrode fingers 22f for a reference potential and the electrode fingers 22f for a signal become inverse to each other for inverting the phases of relative to each other, the unbalanced signal is converted to balanced signals in the second SAW filter part 6.

Further, each of the two second reflector electrodes 24 arranged on the two sides of the five second IDT electrodes 22 includes a pair of bus bars 24b which extend in the Y-direction and are arranged in parallel and electrode fingers 24f each having two ends connected to the pair of bus bars 24b. Among the plurality of electrode fingers 24f of the second reflector electrode 24, the distance between the centers of adjacent electrode fingers 24f is made roughly equal to the distance $p_2$ between the centers of the electrode fingers 22f of the second IDT electrode 22.

Further, the first SAW filter part 5 and the second SAW filter part 6 are arranged on the major surface 3a so as to have a portion in which extension regions of propagation paths overlap when the propagation paths of SAW of the two are extended. Due to this, reduction of the size of the piezoelectric substrate 30 can be achieved. Note that, the two filter parts may be arranged so that the propagation path of the SAW of the first SAW filter part 5 and the propagation path of the SAW of the second SAW filter part 6 do not overlap.

Each of the first resonator 15 and second resonator 16 includes a pair of bus bars extending in the Y-direction and a plurality of electrode fingers extending from each one of the pair of bus bars toward the other bus bar in the same way as the first IDT electrode 21 and second IDT electrode 22.

On the major surface 30a of the piezoelectric substrate 30, a ring-shaped line 32 is formed so as to surround the first SAW filter part 5, second SAW filter part 6, various lines, and various terminals. The ring-shaped line is formed in a frame shape along the periphery of the piezoelectric substrate 30. This ring-shaped line 32 is electrically connected to the reference potential portion G.

When dividing the major surface 30a of the piezoelectric substrate 30 into a left side region and a right side region on the surface of the figure using the first SAW filter part 5 and second SAW filter part 6 as a border, the first unbalanced signal terminal 1 and second unbalanced signal terminal 2 are arranged in the left side region. Further, the first unbalanced signal terminal 1 is arranged beside the first SAW filter part 5 in the X-direction, and the first resonator 15 is arranged between the first unbalanced signal terminal 1 and the first SAW filter part 5. Further, the second unbalanced signal terminal 2 is arranged beside the second SAW filter part 6 in the X-direction, and the second resonator 16 is arranged between the second unbalanced signal terminal 2 and the second SAW filter part 6.

On the other hand, the first balanced signal terminal 3 and the second balanced signal terminal 4 are arranged in the right side region of the major surface 30a. Further, the first balanced signal terminal 3 is located beside the first SAW filter part 5 in the X-direction, and the second balanced signal terminal 4 is located beside the second SAW filter part 6 in the X-direction. Note that, the term "located beside the first SAW filter part" means that, when the region of formation of the first SAW filter part 5 is extended in the X-direction, it is located within that extended region. This is true also for the term "located beside the second SAW filter part".

On the two sides of the first SAW filter part 5, first reference potential lines 13 are provided. More specifically, one first reference potential line 13 is located at a position which is in the region between the first resonator 15 and the first SAW filter part 5 and is closer to the first SAW filter part 5, while the other first reference potential line 13 is located at a position which is in the region between the first balanced signal terminal 3 and the first SAW filter part 5 and is closer to the first SAW filter part 5. Each first reference potential line 13 extends in the Y-direction and has one end connected to the ring-shaped line 32.

One first reference potential line 13 arranged in the region between the first resonator 15 and the first SAW filter part 5 intersects the fifth signal line 11 connecting the first resonator 15 and the first SAW filter part 5 at two positions. In this intersection portion, by interposing an insulator 31 between the two lines, the two lines are prevented from short-circuiting. That is, the first reference potential line 13 and the fifth signal line 11 three-dimensionally intersect in a state where the two lines are insulated. By making the lines in which signals having different potentials flow with respect to each other three-dimensionally intersect in this way, the route of the lines become compact, therefore reduction of the size of the piezoelectric substrate 30 can be achieved and consequently the SAW filter 200 can be reduced in size.

The other first reference potential line 13 arranged in the region between the first balanced signal terminal 3 and the first SAW filter part 5 intersects the first signal line 7 connecting the first balanced signal terminal 3 and the first SAW filter part 5 at one position. In this intersection portion as well, by interposing the insulator 31 between the two lines, the two lines are prevented from short-circuiting. Further, the other first reference potential line 13 intersects the second signal line 9 connecting the second balanced signal terminal 4 and the first SAW filter part 5 at one position. In this intersection portion as well, by interposing the insulator 31 between the two lines, the two lines are prevented from short-circuiting.

Second reference potential lines 14 are provided at the two sides of the second SAW filter part 6. More specifically, one second reference potential line 14 is located at a position in the region between the second resonator 16 and the second SAW filter part 6 and is closer to the second SAW filter part 6, while the other second reference potential line 14 is located at a position in the region between the second balanced signal terminal 4 and the second SAW filter part 6 and is closer to the second SAW filter part 6. Each second reference potential line 14 extends in the Y-direction and has one end connected to the ring-shaped line 32.

One second reference potential line 14 arranged in the region between the second resonator 16 and the second SAW filter part 6 intersects the sixth signal line 12 connecting the second resonator 16 and the second SAW filter part 6 at two positions. In this intersection portion, by interposing the insulator 31 between the two lines, the two lines are prevented from short-circuiting. That is, the second reference potential line 14 and the sixth signal line 12 three-dimensionally intersect.

The other second reference potential line 14 arranged in the region between the second balanced signal terminal 4 and the second SAW filter part 6 intersects the third signal line 8 connecting the second balanced signal terminal 4 and the second SAW filter part 6 at one position. In this intersection portion as well, by interposing the insulator 31 between the two lines, the two lines are prevented from short-circuiting. Further, the other second reference potential line 14 intersects the fourth signal line 10 connecting the first balanced signal terminal 3 and the second SAW filter part 6 at one position. In this intersection portion as well, by interposing the insulator 31 between the two lines, the two lines are prevented from short-circuiting.

Further, the second signal line 9 and the fourth signal line 10 three-dimensionally intersect at one position. That is, the fourth signal line 10 has an intersection portion which is a portion three-dimensionally intersecting with the second signal line 9. In this intersection portion as well, by interposing the insulator 31 between the two lines, the two lines are prevented from short-circuiting.

Here, in a case where the pass frequency band of the first SAW filter part 5 and the pass frequency band of the second SAW filter part 6 are different as in the SAW filter 200, it is confirmed by the present inventors that the electrical characteristics of the filters can be adjusted by changing the vertical positional relationships of the second signal line 9 and fourth signal line 10 in the three-dimensional intersection portion of the two lines.

Specifically, in the case where the pass frequency band of the first SAW filter part 5 is lower than the pass frequency band of the second SAW filter part 6 as in the SAW filter 200, if the two lines are three-dimensionally intersected so that the second signal line 9 which is connected to the first SAW filter part 5 having a low pass frequency band is arranged above the fourth signal line 10, that is, a part of the second signal line 9 is laminated on the insulator 31 which is laminated on a portion of the fourth signal line 10, compared with a filter having a vertical relationship inverted, the frequency characteristics and VSWR (voltage standing wave ratio) characteristics tend to be improved.

On the other hand, in the case where the pass frequency band of the first SAW filter part 5 is lower than the pass frequency band of the second SAW filter part 6 as in the SAW filter 200, if the two lines are three-dimensionally intersected so that the second signal line 9 which is connected to the first SAW filter part 5 having a low pass frequency band is arranged under the fourth signal line 10, compared with a filter having a vertical relationship inverted, the attenuation tends to become large in a band on the low frequency side out of the pass frequency band.

Accordingly, by determining the vertical positional relationships of the second signal line 9 and fourth signal line 10 in the three-dimensional intersection portion by the two lines in accordance with the demand of characteristics from the filters, SAW filters excellent in electrical characteristics can be formed.

It was confirmed by experiments explained later that the electrical characteristics of the filters change by changing the vertical positional relationships of the lines in the portion where the lines three-dimensionally intersect in this way. The reason for that is not always apparent, but the following is considered as one of the reasons. For example, if the second signal line 9 is arranged above the fourth signal line 10, the second signal line 9 becomes longer in length than the fourth signal line 10 by the amount of upward expansion in the three-dimensional intersection portion or a contact resistance is generated in a joint between the part of the second signal line 9 which is arranged on the insulator 31 and the part of the second signal line 9 which is arranged on the piezoelectric substrate 30, therefore the second signal line 9 obtains a wiring resistance larger compared with the fourth signal line 10. It is guessed that there is a difference of resistance value between the lines, consequently an impedance of the SAW filter 200 changes and thereby influences the electrical characteristics.

By employing such a wiring structure, sharing of the output terminal of the first SAW filter part 5 and the output terminal of the second SAW filter part 6 is realized.

As explained above, in order to suppress leakage of signal due to sharing of the output terminals of the two filter parts, the impedances of the first SAW filter part 5 and second SAW filter part 6 are adjusted. However, in order to improve the insertion loss characteristic of the SAW filter 200 more, sometimes only adjustment of the impedances of the first SAW filter part 5 and second SAW filter part 6 is insufficient. Therefore, the present inventors engaged in further studies and consequently found out that the insertion loss characteristic of the SAW filter 200 could be improved by employing a predetermined arrangement of signal lines connected to the first balanced signal terminal 3 and the second balanced signal terminal 4.

Specifically, the second signal line 9 and the fourth signal line 10 having three-dimensional intersection portions extend in directions which are inclined relative to the other lines. In other words, the second signal line 9 and fourth signal line 10 are formed in a state where almost no parallel portion exists. When the second signal line 9 and fourth signal line 10 are formed so as to have parallel portions (see FIG. 3), it is considered that capacity coupling, inductive coupling, or other electromagnetic coupling is formed in those portions, and the signal leakage from one signal line to the other signal line occurs due to this electromagnetic coupling. Contrary to this, according to the SAW filter 200, the second signal line 9 and the fourth signal line 10 extend in directions inclined relative to the other lines, therefore electromagnetic coupling between the two lines can be kept small. For this reason, leakage of signal between the two lines can be suppressed, therefore the insertion loss characteristic of the SAW filter 200 can be improved. Note that, so long as the second signal line 9 and the fourth signal line 10 extend toward the terminals to which they are connected by themselves and are inclined relative to the other lines in the portion where they intersect with each other (the intersection portion of the fourth signal line 10), the portion where the lines become parallel can be reduced more than that of the comparative example shown in FIG. 3. Therefore, at least the intersection portion of the fourth signal line 10 has only to extend in the direction toward the first balanced signal terminal 3 and be inclined relative to the second signal line 9.

An angle α in the portion where the second signal line 9 and the fourth signal line 10 intersect is set to for example 20° to 45°. By setting the angle α within a range of 20° to 45°, reduction of size of the piezoelectric substrate can be realized while suppressing leakage of signal between the lines.

Further, the fourth signal line 10 extends in a direction inclined also with respect to the first reference potential line 13 which is arranged between the first SAW filter part 5 and the first balanced signal terminal 3. That is, in contrast to the first reference potential line 13 which extends in the Y-direction, the fourth signal line 10 extends in a direction inclined relative to the Y-direction, therefore almost no parallel portion exists between the first reference potential line 13 and the fourth signal line 10. By giving such a positional relationship to the first reference potential line 13 and the fourth signal line 10, the electromagnetic coupling which happens between the two lines can be weakened. Due to this, leakage of the balanced signal, which was output from the second SAW filter part 6 to the fourth signal line 10, to the first reference potential line 13 can be suppressed, and the insertion loss characteristic of the SAW filter 200 can be further improved.

Regarding the second signal line 9 as well, for the same reason as that for the fourth signal line 10, it extends in a direction inclined relative to the second reference potential line 14 arranged between the second SAW filter part 6 and the second balanced signal terminal 4. Due to this, the electromagnetic coupling which may happen between the second reference potential line 14 and the second signal line 9 can be weakened, and the leakage of the balanced signal which was output from the first SAW filter part 5 to the second signal line 9 to the second reference potential line 14 can be suppressed.

The angle formed by the fourth signal line 10 together with the first reference potential line 13 and the angle formed by the second signal line 9 together with the second reference potential line 14 are made equal. This angle β is set to for example 10° to 45°.

Further, the fourth signal line 10 is straight in shape from the connection portion with the second IDT electrode 22 up to the connection portion with the first balanced signal terminal 3. Due to this, the second IDT electrode 22 and the first balanced signal terminal 3 can be connected with roughly the shortest distance, therefore excessive detouring of the fourth signal line 10 is eliminated, reduction of the size of the piezoelectric substrate 30 can be achieved, and generation of unnecessary inductor in the fourth signal line 10 can be suppressed. Note that, the fourth signal line 10 is bent in the vicinity of the connection portion with the second IDT electrode 22. This is for easy three-dimensional intersection of the second reference potential line 14 and the second IDT electrode 22. Note, this bending portion is sufficiently smaller compared with the entire length of the fourth signal line 10 and is about 10% based on the whole length, and the influence of the inductance of that portion exerted upon the characteristics is almost negligible.

In the same way as the fourth signal line 10, the second signal line 9 is straight in shape from the connection portion with the first IDT electrode 21 up to the connection portion with the second balanced signal terminal 4. Due to this, the first IDT electrode 21 and the second balanced signal terminal 4 can be connected with the shortest distance. Therefore, excessive detouring of the second signal line 9 is eliminated, reduction of size of the piezoelectric substrate 30 is achieved, and formation of an unnecessary inductor in the second signal line 9 can be suppressed. Also the vicinity of the connection portion between the second signal line 9 and the first IDT electrode 21 is bent in the same way as the fourth signal line 10. For the same reason, the influence of the inductor of that portion exerted upon the characteristics is almost negligible.

The various types of lines, electrodes, and terminals are formed by for example metal. As the metal, for example, use can be made of Al, an alloy containing Al as a major ingredient (Al alloy), and so on. As the Al alloy, for example, use can be made of an Al—Cu alloy obtained by adding Cu to Al. Further, these lines and the like may be formed not only by a single metal, but also by laminate of two or more metal materials. As the laminate structure, for example, there can be mentioned lamination of Al on Ti. Further, Cr, Ni, Au, and so on may be laminated in this order on the terminal or line used for mounting when the piezoelectric substrate 30 is flip-chip mounted on another substrate by using solder.

Further, the various lines, electrodes, and terminals may be coated by protective film made of insulation material such as $SiO_2$ or SiN as well. Due to this, corrosion of the various lines, electrodes, and terminals can be suppressed. Note that, the portions used for mounting the piezoelectric substrate 30 on another substrate are not covered by a protective film.

As described above, by arranging filter parts and terminals and laying the lines by using the three-dimensional line structure, a SAW filter 200 excellent in the insertion loss characteristic can be formed while sharing the output terminals (first balanced signal terminal 3 and second balanced signal terminal 4) of the first SAW filter part 5 and second SAW filter part 6.

Note that, in the above embodiment, the SAW filter 200 is one example of the acoustic wave filter of the present invention, the first SAW filter part 5 is one example of the first acoustic wave filter part, and the second SAW filter part 6 is one example of the second acoustic wave filter part.

Examples

The SAW filter in Example 1 which is configured by the line pattern shown in FIG. 2 was investigated for the frequency characteristic and VSWR characteristic by simulation calculation.

The parameters used in the computation are shown in Table 1.

TABLE 1

|  | First SAW filter part 5 | Second SAW filter part 6 |
| --- | --- | --- |
| Piezoelectric substrate | 42°Y-cut X-propagating $LiTaO_3$ | |
| Film thickness of IDT electrode | 1600 Å | |
| Pass frequency band | 1805 MHz to 1880 MHz | 1930 MHz to 1990 MHz |
| Number of electrode fingers of IDT electrode | 17/54/60/54/18 | 17/42/40/42/18 |
| Number of electrode fingers of reflector electrode | 100/100 | 100/100 |
| Mean value (µm) of distance between centers of adjacent electrode fingers | 1.09/1.11/1.10/1.10/1.09 | 0.99/1.01/1.01/1.01/0.99 |
| Crossing width of electrode fingers | 55 µm | 57 µm |
| Electrode duty | 0.65 | 0.63 |

In Table, "17/54/60/54/18" described in the section of the "Number of electrode fingers of IDT electrode" of the first SAW filter part 5 is the number of electrode fingers 21f of each of the five IDT electrodes 21 in the first SAW filter part 5 in FIG. 2. These are described in order from the IDT electrode 21 on the bottom side of the drawing sheet surface. This is true also for the "Number of electrode fingers of IDT electrode" of the second SAW filter part 6.

Further, in Table, "1.09/1.11/1.10/1.10/1.09" described in the section of the "Mean value of distance between centers of adjacent electrode fingers" of the first SAW filter part 5 is the mean value of the distance $p_1$ between the centers of electrode fingers for each of the five IDT electrodes 21 in the first SAW filter part 5 in FIG. 2. They are described in order from the IDT electrode 21 on the bottom side of the drawing sheet surface. This is true also for the "Mean value of distance between centers of adjacent electrode fingers" of the IDT electrode in the second SAW filter part 6.

Further, the impedance is determined as 50Ω for the input side and as 50Ω for each terminal on the output side. 5.6 nH of inductance is added between the outputs.

Figure 3:
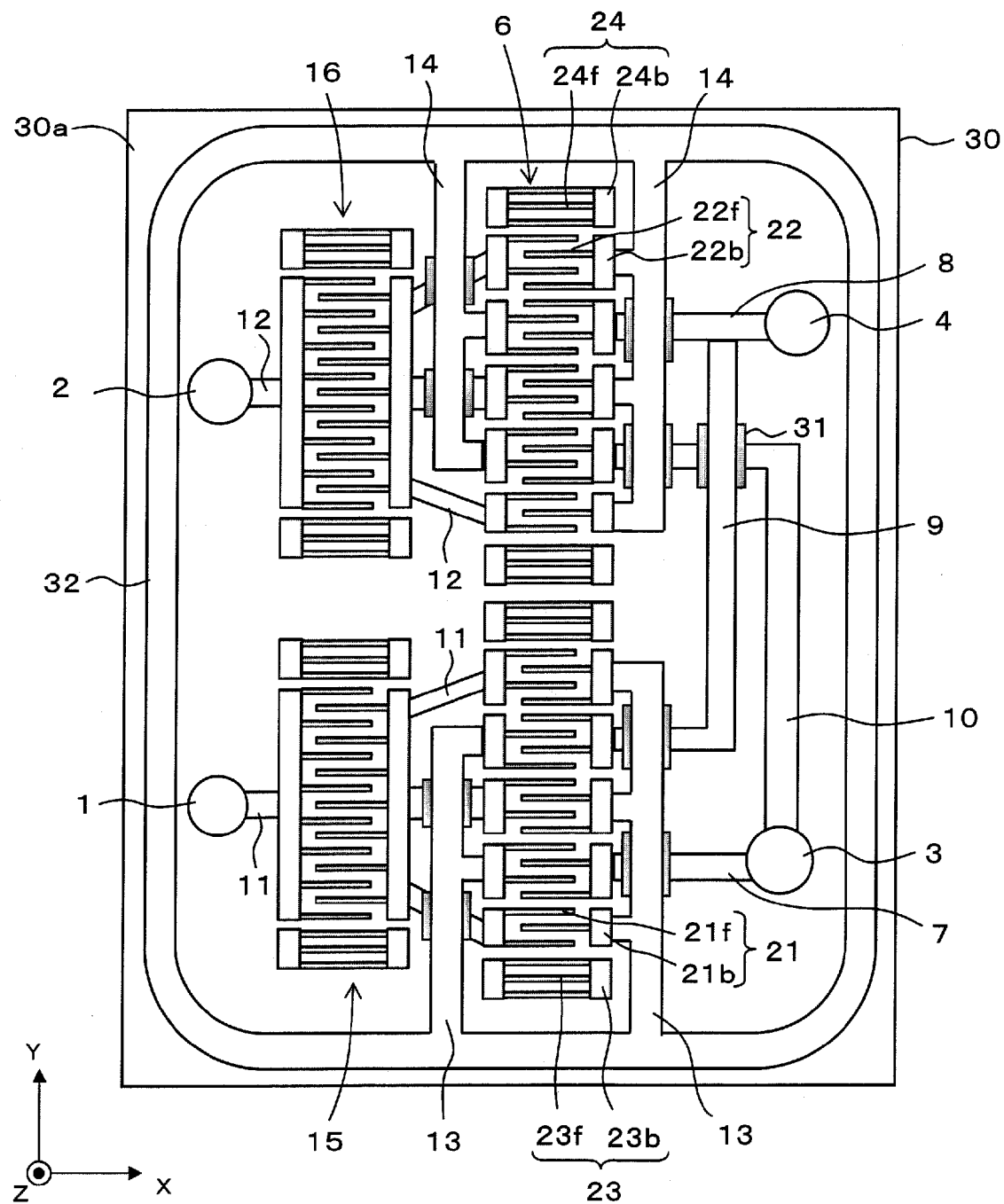
FIG. 3A plan view of a SAW filter in a comparative example.

FIG. 3 is a plan view of a SAW filter in a comparative example. The SAW filter in the comparative example is a filter in which the fourth signal line 10 extends parallel relative to the second signal line 9. Further, in the SAW filter in the comparative example, the fourth signal line 10 and the second signal line 9 respectively extend parallel with respect to the first reference potential line 13 and the second reference potential line 14. All components are the same between Example 1 and the comparative example including parameters used in computation as well with exception of the former.

FIG. 4 and FIG. 5 show graphs of the results obtained by computation for the characteristics of Example 1 and the comparative example. In the graphs, the solid lines show Example 1, and the broken lines show the comparative example.

Figure 4A:
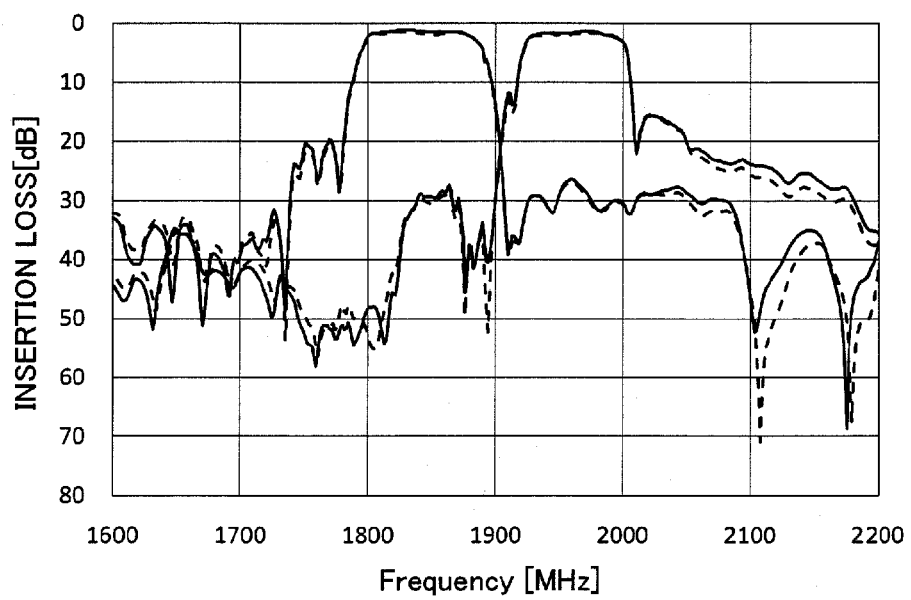
Figure 4B:
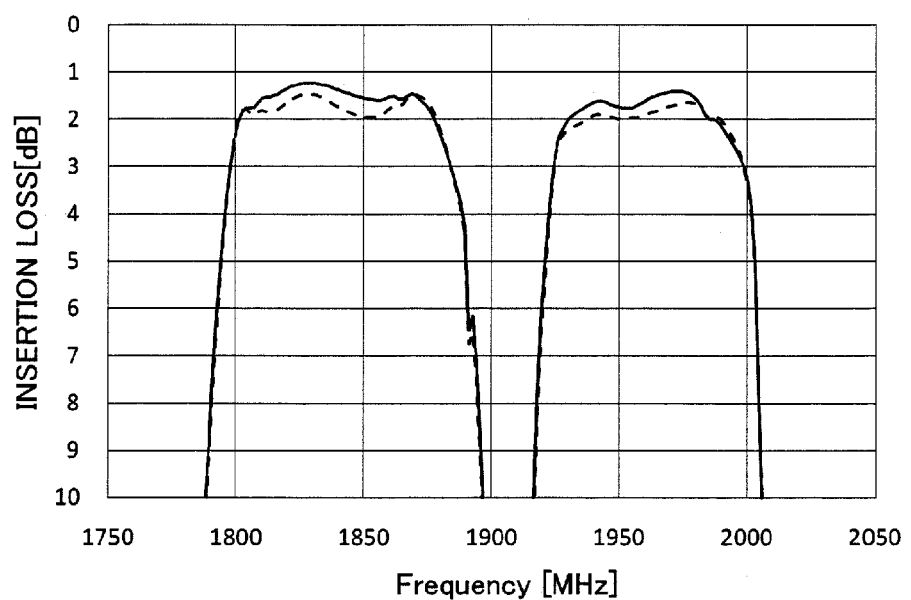
FIG. 4B is an enlarged view of the vicinity of the pass frequency band in FIG. 4A.

FIG. 4 are graphs showing the results of computation of the frequency characteristics. The abscissas in the graphs show the frequencies, while the ordinates show the insertion losses of the signals. Note that, FIG. 4B is an enlarged diagram of the vicinity of the pass frequency band in FIG. 4A.

As shown in FIG. 4, in Example 1, the insertion loss is improved more than that in the comparative example. Specifically, the insertion loss of the first SAW filter part 5 (frequency band: 1805 MHz to 1880 MHz) is improved by 0.4 dB, and the insertion loss of the second SAW filter part 6 (frequency band: 1930 MHz to 1990 MHz) is improved by 0.3 dB. It could be confirmed from this result that the deterioration of insertion loss could be suppressed according to the SAW filter of Example 1.

Figure 5A:
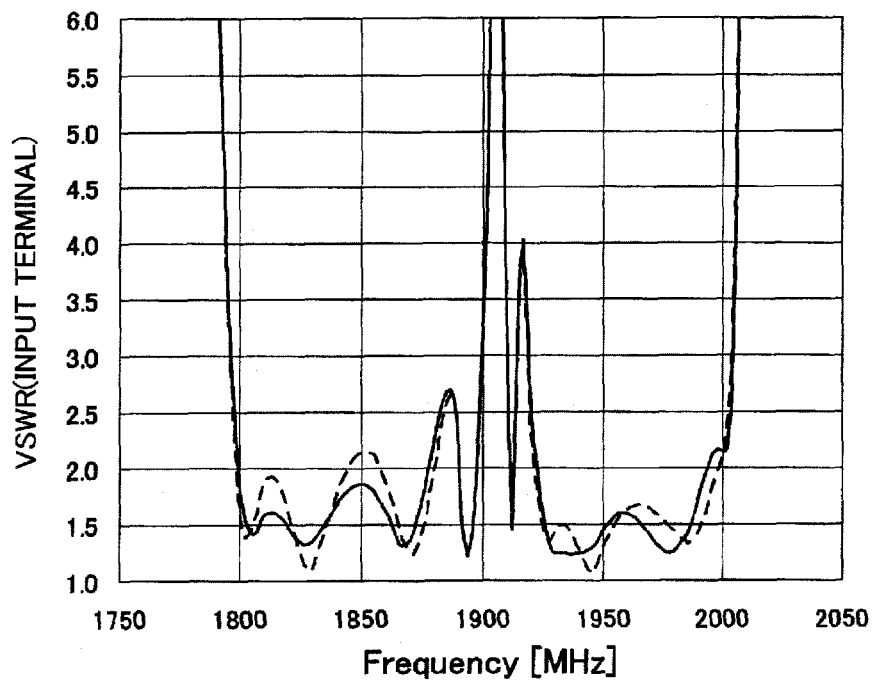
Figure 5B:
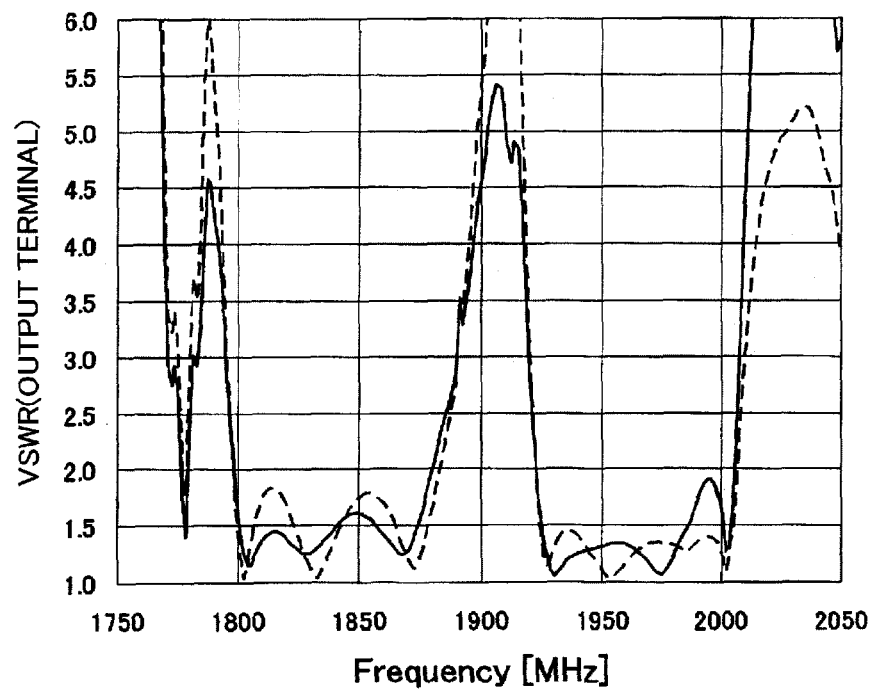
FIG. 5B is a graph showing the results of computation of the VSWR characteristics of output terminals in Example 1 and a comparative example.

FIG. 5 are graphs showing the results of computation of the VSWR characteristics. The abscissas of the graphs show the frequencies, and the ordinates show the VSWR. FIG. 5A shows the results of computation of VSWR viewed from the input terminals (first unbalanced signal terminal 1, second unbalanced signal terminal 2), and FIG. 5B shows the results of computation of VSWR viewed from the output terminals (first balanced signal terminal 3, second balanced signal terminal 4).

As shown in FIG. 5, Example 1 is excellent in both of the VSWR characteristic of the input terminal and VSWR characteristic of the output terminal in the first SAW filter part 5 more than those in the comparative example. Specifically, both of the VSWR of the input terminal and VSWR of the output terminal in the first SAW filter part 5 are improved by 0.3 in Example 1 more than those in the comparative example. Note that, the VSWR of the input terminal and the VSWR of the output terminal in the second SAW filter part 6 were equal between Example 1 and the comparative example. It can be said from this result that there is an effect of improvement in the SAW filter of Example 1 for the VSWR characteristic as well.

Next, a SAW filter configured by a line pattern shown in FIG. 2 was prepared, and the influence due to a difference of the vertical positional relationships of the second signal line 9 and the fourth signal line 10 in the three-dimensional intersection portion of the two lines which was exerted upon the frequency characteristic and VSWR characteristic was confirmed. The SAW filter in which the second signal line 9 is arranged above the fourth signal line is Example 2, and the SAW filter in which the fourth signal line 10 is arranged above the second signal line 9 is Example 3.

All of the conditions of preparation of the SAW filters in Example 2 and Example 3 are the same as those explained in Example 1. Note that, the second signal line 9 and fourth signal line 10 were basically formed by Al. However, in the portion where the two lines three-dimensionally intersected, the portion arranged in the upper part (the portion laminated on the insulator 31) was formed by Cr, Ni, and Au, and the insulator 31 interposed between the two lines was formed by polyimide.

Figure 6A:
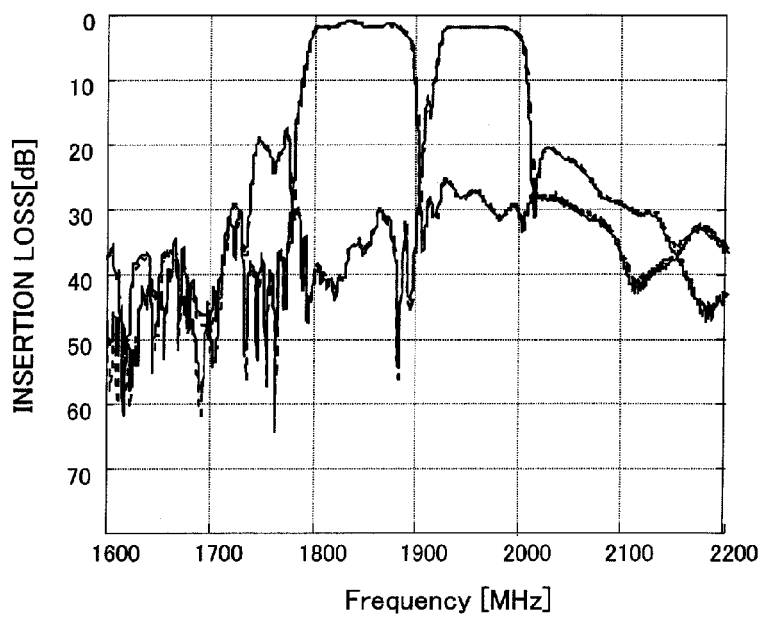
Figure 6B:
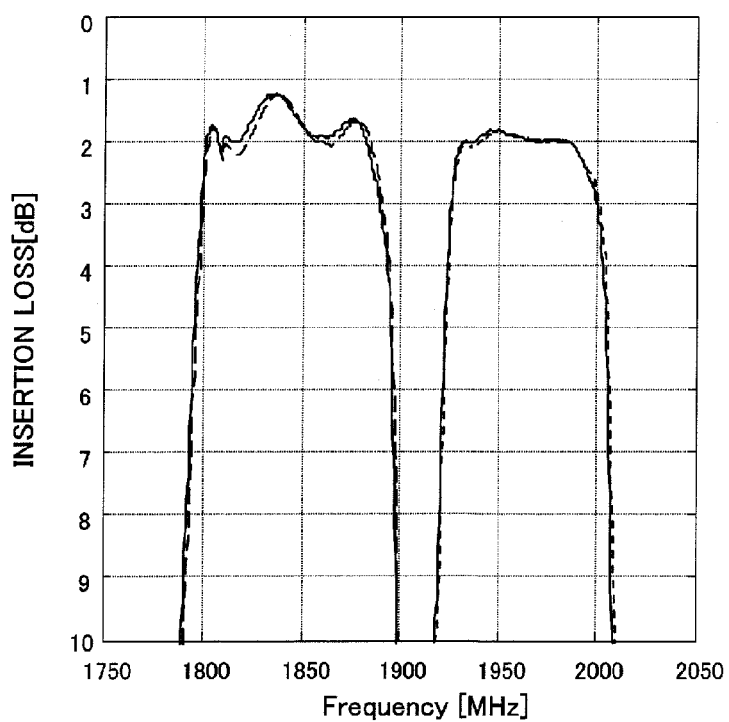
FIG. 6B is an enlarged view of the vicinity of the pass frequency band in FIG. 6A.

FIG. 6 are graphs showing the measurement results of the frequency characteristics. In the graphs, the solid lines indicate Example 2, and the broken lines indicate Example 3. The abscissas in the graphs represent the frequencies, and the ordinates represent insertion losses of the signals. Note that, FIG. 6B is an enlarged view of the vicinity of the pass frequency band in FIG. 6A.

As shown in FIG. 6, no large difference was seen between Example 2 and Example 3 in the pass frequency band of the second SAW filter part 6 (1930 MHz to 1990 MHz). However, in the pass frequency band of the first SAW filter part 5 (1805 MHz to 1880 MHz), the frequency characteristic of Example 2 is improved by 0.2 dB more than the frequency characteristic of Example 3. That is, it was confirmed that, in the portion where the lines three-dimensionally intersected, by arranging the second signal line 9 connected to the first SAW filter part 5 having a low pass frequency band above the fourth signal line 10 connected to the second SAW filter part 6 having a high pass frequency band, the frequency characteristic could be improved in the SAW filter as a whole.

Figure 7A:
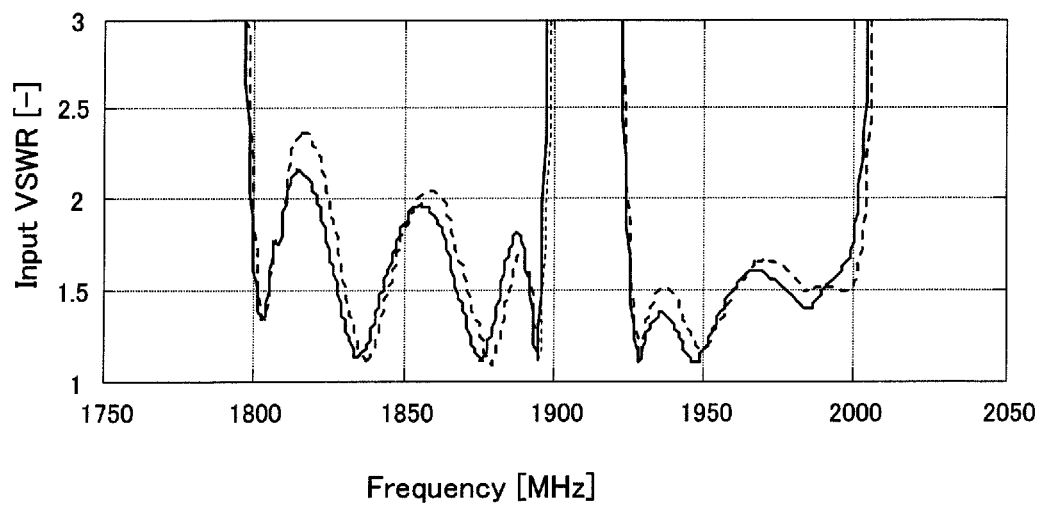
Figure 7B:
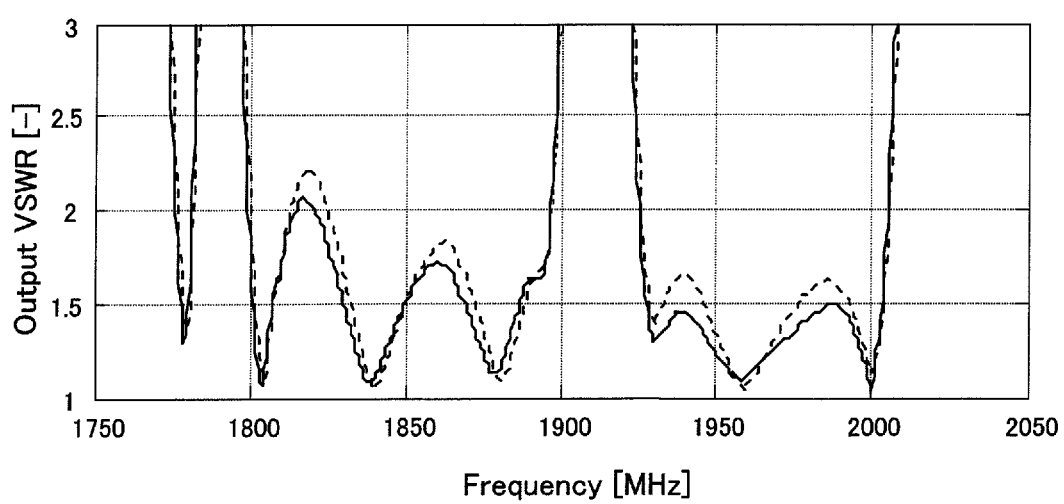
FIG. 7B is a graph showing the results of measurement of the VSWR characteristics of the output terminals in Example 2 and Example 3.

FIG. 7 are graphs showing the measurement results of the VSWR characteristics. In the graphs, the solid lines indicate Example 2, and the broken lines indicate Example 3. The abscissas in the graphs represent the frequencies, and the ordinates represent VSWR. FIG. 7A shows the measurement results of VSWR viewed from the input terminals, and FIG. 7B shows the measurement results of VSWR viewed from the output terminals.

As shown in FIG. 7, in both of the input terminal and output terminal, the VSWR of Example 2 is improved more than the VSWR in Example 3. Specifically, in the first SAW filter part 5 (pass frequency band: 1805 MHz to 1880 MHz), both of the VSWR of the input terminal and the VSWR of the output terminal are improved by 0.2. In the second SAW filter part 6 (pass frequency band: 1930 MHz to 1990 MHz), the VSWR of the input terminal is improved by 0.2, and the VSWR of the output terminal is improved by 0.3.

It could be confirmed from this result that, in the portion where the lines three-dimensionally intersected, by arranging the second signal line 9 connected to the first SAW filter part 5 having a low pass frequency band above the fourth signal line 10 connected to the second SAW filter part 6 having a high pass frequency band, the VSWR characteristics of the SAW filters could be improved.

Figure 8A:
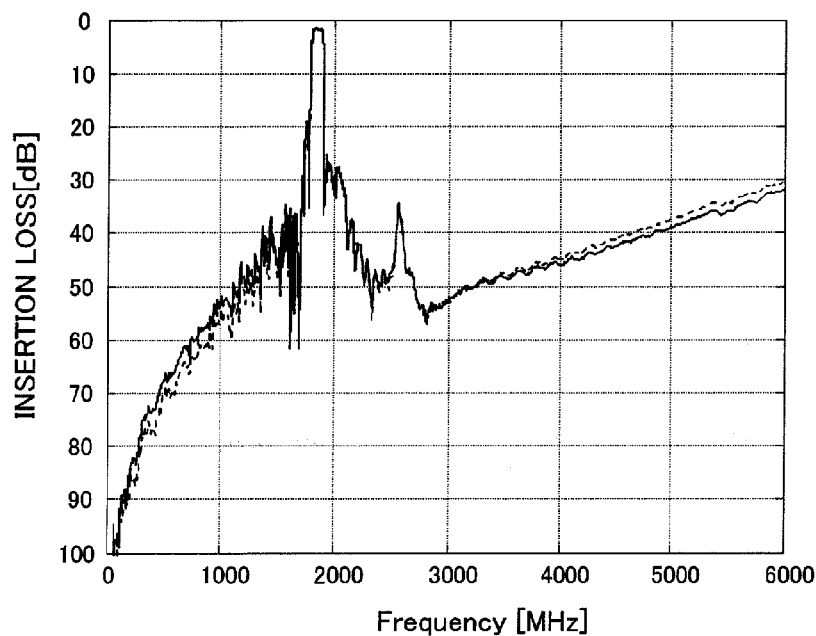
Figure 8B:
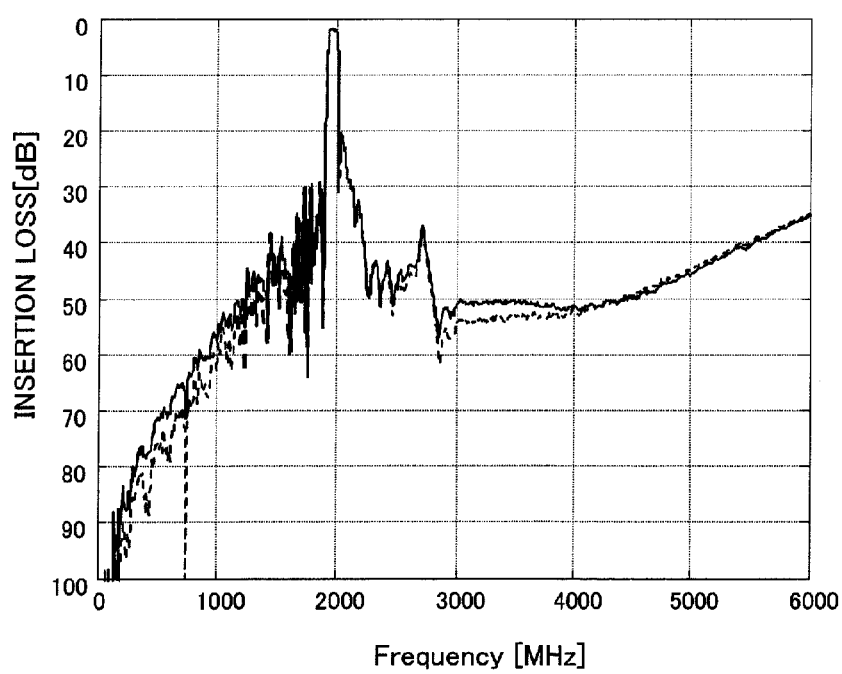
FIG. 8B is a graph showing the results of measurement of frequency characteristics in a broad range in second SAW filter parts in Example 2 and Example 3.

FIG. 8 are graphs showing the measurement results of the frequency characteristics in a broad range band including the pass frequency band. In the graphs, the solid lines indicate Example 2, and the broken lines indicate Example 3. The abscissas in the graphs represent the frequencies, and the ordinates represent the insertion losses of the signals. Note that, FIG. 8A is a graph showing the frequency characteristics including the pass frequency band of the first SAW filter part 5 (1805 MHz to 1880 MHz), and FIG. 8B is a graph showing the frequency characteristics including the pass frequency band of the second SAW filter part 6 (1930 MHz to 1990 MHz).

As shown in FIG. 8, in both of the first SAW filter part 5 and second SAW filter part 6, the attenuation amounts out of the pass frequency band on the low frequency side in Example 3 become larger than those in Example 2.

It could be confirmed from this result that, in the portion where the lines three-dimensionally intersected, by arranging the fourth signal line 10 connected to the second SAW filter part 6 having a high pass frequency band above the second signal line 9 connected to the first SAW filter part 5 having a low pass frequency band, the attenuation amounts on the low frequency side out of the pass frequency band of the SAW filters could be made large.

The present invention is not limited to the above embodiments and may be executed in various ways.

The number of IDT electrodes, form of input/output, and so on can be modified in various ways other than those illustrated in the embodiments. They may be suitably set.

REFERENCE SIGNS LIST

1 . . . first unbalanced signal terminal
2 . . . second unbalanced signal terminal
3 . . . first balanced signal terminal
4 . . . second balanced signal terminal
5 . . . first SAW filter part
6 . . . second SAW filter part
7 . . . first signal line
8 . . . third signal line
9 . . . second signal line
10 . . . fourth signal line

The invention claimed is:
1. An acoustic wave filter, comprising:
a substrate;
a first acoustic wave filter part which
    comprises a plurality of first IDT electrodes arranged in a line, and
    generates an acoustic wave propagating in a first direction of a major surface of the substrate and includes a pass frequency band;
a second acoustic wave filter part which
    comprises a plurality of second IDT electrodes arranged in a line,
    generates an acoustic wave propagating in the first direction and includes a pass frequency band, and
    the pass frequency band of the second acoustic wave filter part is different from the pass frequency band of the first acoustic wave filter part;
a first unbalanced signal terminal which
    is located in a region on one sides of the first acoustic wave filter part and the second acoustic wave filter part in a direction perpendicular to the first direction, and
    is electrically connected to the first acoustic wave filter part;

a second unbalanced signal terminal which
   is located in the region on the one sides, and
   is electrically connected to the second acoustic wave filter part;
a first balanced signal terminal which
   is located next to the first acoustic wave filter part so that the first acoustic wave filter part is located between the first balanced signal terminal and the first unbalanced signal terminal;
a second balanced signal terminal which
   is located next to the second acoustic wave filter part so that the second acoustic wave filter part is located between the second balanced signal terminal and the second unbalanced signal terminal;
a first signal line connecting one first IDT electrode of the plurality of first IDT electrodes with the first balanced signal terminal;
a second signal line connecting another one first IDT electrode of the plurality of first IDT electrodes with the second balanced signal terminal, the another one first IDT electrode being located on a side closer to the second acoustic wave filter part than the one first IDT electrode connected to the first balanced signal terminal;
a third signal line connecting one second IDT electrode of the plurality of second IDT electrodes with the second balanced signal terminal; and
a fourth signal line which
   connects another one second IDT electrode of the plurality of second IDT electrodes with the first balanced signal terminal, the another one second IDT electrode being located on a side closer to the first acoustic wave filter part than the one second IDT electrode connected to the second balanced signal terminal, and
   comprises an intersection portion three-dimensionally intersecting with a part of the second signal line, the intersection portion extending in a direction inclined relative to the second signal line on the major surface.

2. The acoustic wave filter according to claim 1,
further comprising a first reference potential line which
   is located between the first acoustic wave filter part and the first balanced signal terminal,
   is electrically connected to the first acoustic wave filter part, and
   extends in the first direction,
wherein the fourth signal line extends in a direction inclined relative to the first reference potential line in the major surface of the substrate.

3. The acoustic wave filter according to claim 1, wherein
the second signal line is straight in shape from the connection portion with the first IDT electrode to the connection portion with the second balanced signal terminal, and
the fourth signal line is straight in shape from the connection portion with the second IDT electrode to the connection portion with the first balanced signal terminal.

4. The acoustic wave filter according to claim 3,
further comprising a second reference potential line which
   is located between the second acoustic wave filter part and the second balanced signal terminal,
   is electrically connected to the second acoustic wave filter part, and
   extends in the first direction.

5. The acoustic wave filter according to claim 1, wherein
the first and second acoustic wave filter parts configure a longitudinally coupled resonator type acoustic wave filter.

6. The acoustic wave filter according to claim 1, wherein
the pass frequency band of the first acoustic wave filter part is lower than the pass frequency band of the second acoustic wave filter part,
in a portion where the second signal line three-dimensionally intersects with the intersection portion of the fourth signal line, an insulator interposed between the second signal line and the intersection portion of the fourth signal line is further comprised, and
the second signal line is laminated on the insulator which is laminated on the intersection portion of the fourth signal line.

* * * * *